(12) United States Patent
Hishida et al.

(10) Patent No.: US 8,461,667 B2
(45) Date of Patent: Jun. 11, 2013

(54) SEMICONDUCTOR DEVICE

(75) Inventors: Takeshi Hishida, Kanagawa (JP); Tsutomu Igarashi, Kanagawa (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 204 days.

(21) Appl. No.: 12/690,973

(22) Filed: Jan. 21, 2010

(65) Prior Publication Data

US 2010/0193894 A1 Aug. 5, 2010

(30) Foreign Application Priority Data

Jan. 30, 2009 (JP) .................................. 2009-020255

(51) Int. Cl.
*H01L 23/58* (2006.01)
(52) U.S. Cl.
USPC ........... 257/659; 257/409; 257/422; 257/730; 174/350; 174/360; 174/388; 174/390; 361/816; 361/818; 307/89; 307/91
(58) Field of Classification Search
USPC .................................................. 257/490, 688
See application file for complete search history.

(56) References Cited

U.S. PATENT DOCUMENTS

| | | | | |
|---|---|---|---|---|
| 5,045,913 | A * | 9/1991 | Masleid et al. | 257/409 |
| 5,538,924 | A * | 7/1996 | Chen | 438/132 |
| 5,804,869 | A * | 9/1998 | Hadizad et al. | 257/632 |
| 5,889,314 | A * | 3/1999 | Hirabayashi | 257/508 |
| 5,926,697 | A * | 7/1999 | Yaung et al. | 438/132 |
| 6,313,900 | B1 * | 11/2001 | Kawata | 349/153 |
| 6,492,716 | B1 * | 12/2002 | Bothra et al. | 257/678 |
| 6,509,617 | B2 * | 1/2003 | Hiraga | 257/409 |
| 6,876,064 | B2 * | 4/2005 | Matumoto et al. | 257/632 |
| 6,940,131 | B2 * | 9/2005 | Baldwin et al. | 257/355 |
| 6,989,566 | B2 * | 1/2006 | Noda et al. | 257/339 |
| 7,138,700 | B2 * | 11/2006 | Tomita et al. | 257/529 |
| 7,235,864 | B2 * | 6/2007 | Lee | 257/620 |
| 7,253,487 | B2 * | 8/2007 | Chen | 257/409 |
| 7,408,206 | B2 * | 8/2008 | DeVries et al. | 257/127 |
| 7,413,917 | B2 * | 8/2008 | Gallup et al. | 438/27 |
| 7,615,848 | B2 * | 11/2009 | Uchikoshi et al. | 257/620 |
| 7,667,302 | B1 * | 2/2010 | Chang et al. | 257/659 |
| 7,705,462 | B2 * | 4/2010 | Uchikoshi et al. | 257/758 |
| 7,772,682 | B1 * | 8/2010 | Zhang et al. | 257/684 |
| 7,777,338 | B2 * | 8/2010 | Yao et al. | 257/758 |
| 7,893,459 | B2 * | 2/2011 | Wang et al. | 257/170 |
| 7,898,056 | B1 * | 3/2011 | Keramat et al. | 257/503 |
| 8,232,593 | B2 * | 7/2012 | Saito et al. | 257/329 |
| 2001/0038138 | A1 * | 11/2001 | Miles et al. | 257/544 |
| 2002/0167071 | A1 * | 11/2002 | Wang | 257/620 |
| 2003/0160261 | A1 * | 8/2003 | Moriya | 257/127 |
| 2003/0218254 | A1 * | 11/2003 | Kurimoto et al. | 257/758 |
| 2004/0075157 | A1 * | 4/2004 | Konishi et al. | 257/503 |
| 2004/0150070 | A1 * | 8/2004 | Okada et al. | 257/508 |
| 2005/0161732 | A1 * | 7/2005 | Mizukami et al. | 257/327 |

(Continued)

FOREIGN PATENT DOCUMENTS

JP 2006-261613 A 9/2006

*Primary Examiner* — Matthew W Such
*Assistant Examiner* — William Harriston
(74) *Attorney, Agent, or Firm* — Westerman, Hattori, Daniels & Adrian, LLP

(57) ABSTRACT

A semiconductor device includes a semiconductor chip, and a guard ring made of an electrically conductive material and arranged between electrodes on the semiconductor chip and side edges of the semiconductor chip, the guard ring being divided by isolating sections on the semiconductor chip.

3 Claims, 6 Drawing Sheets

U.S. PATENT DOCUMENTS

| | | | |
|---|---|---|---|
| 2005/0167694 A1* | 8/2005 | Takahashi | 257/127 |
| 2005/0265722 A1* | 12/2005 | Gallup et al. | 398/101 |
| 2006/0011973 A1* | 1/2006 | Mizukami et al. | 257/330 |
| 2006/0071292 A1* | 4/2006 | Coolbaugh et al. | 257/480 |
| 2007/0262390 A1* | 11/2007 | Ishida et al. | 257/368 |
| 2008/0061397 A1* | 3/2008 | Uchida | 257/508 |
| 2010/0078754 A1* | 4/2010 | Veliadis et al. | 257/491 |
| 2010/0102421 A1* | 4/2010 | Chang et al. | 257/659 |
| 2010/0193894 A1* | 8/2010 | Hishida et al. | 257/490 |
| 2010/0245809 A1* | 9/2010 | Andreou et al. | 356/222 |
| 2011/0156854 A1* | 6/2011 | Lee | 336/200 |

\* cited by examiner

COMPARATIVE EXAMPLE

COMPARATIVE EXAMPLE

SEMICONDUCTOR DEVICE

CROSS-REFERENCE TO RELATED APPLICATION

This application is based upon and claims the benefit of priority of the prior Japanese Patent Application No. 2009-020255, filed on Jan. 30, 2009, the entire contents of which are incorporated herein by reference.

BACKGROUND (i) Technical Field

The present invention relates to a semiconductor device, and more particularly to a semiconductor device having a guard ring.

(ii) Related Art

Water or moisture penetration in a semiconductor chip is a factor that degrades the reliability and performance. Thus, there are many proposals for preventing water penetration into the semiconductor chips.

An exemplary proposal is to form a conductive moisture resistance ring so as to surround a circuit forming area on a semiconductor chip to thus prevent water penetration in the circuit forming area (for example, Japanese Patent Application Publication No. 2006-261613).

The guard ring that runs along the sides of the semiconductor chip and completely surround the circuit forming area may cause a problem such that, once water penetration in the semiconductor chip occurs, a short circuit between electrodes on the chip may take place and an operative fault may occur.

SUMMARY

It is an object of the present invention to provide a semiconductor device capable of preventing the occurrence of a short circuit between electrodes in a semiconductor chip caused by water penetration beyond a guard ring.

According to an aspect of the present invention, there is provided a semiconductor device including: a semiconductor chip; and a guard ring made of an electrically conductive material and arranged between electrodes on the semiconductor chip and side edges of the semiconductor chip, the guard ring being divided by isolating sections on the semiconductor chip.

According to another aspect of the present invention, there is provided a semiconductor device including: a semiconductor chip; first electrodes provided on the semiconductor chip; and a second electrode provided on the semiconductor chip and has a greater potential difference with respect to a backside potential of the semiconductor chip than potential differences between the first electrodes and the backside potential of the semiconductor chip; and guard rings which are electrically conductive and includes a first guard ring arranged between a first electrode and a side edge of the semiconductor chip, and a second guard ring arranged between a second electrode and another side edge of the semiconductor chip, the first and second guard rings being electrically isolated from each other by guard ring isolating sections provided on the semiconductor chip.

DETAILED DESCRIPTION

Figure 1:
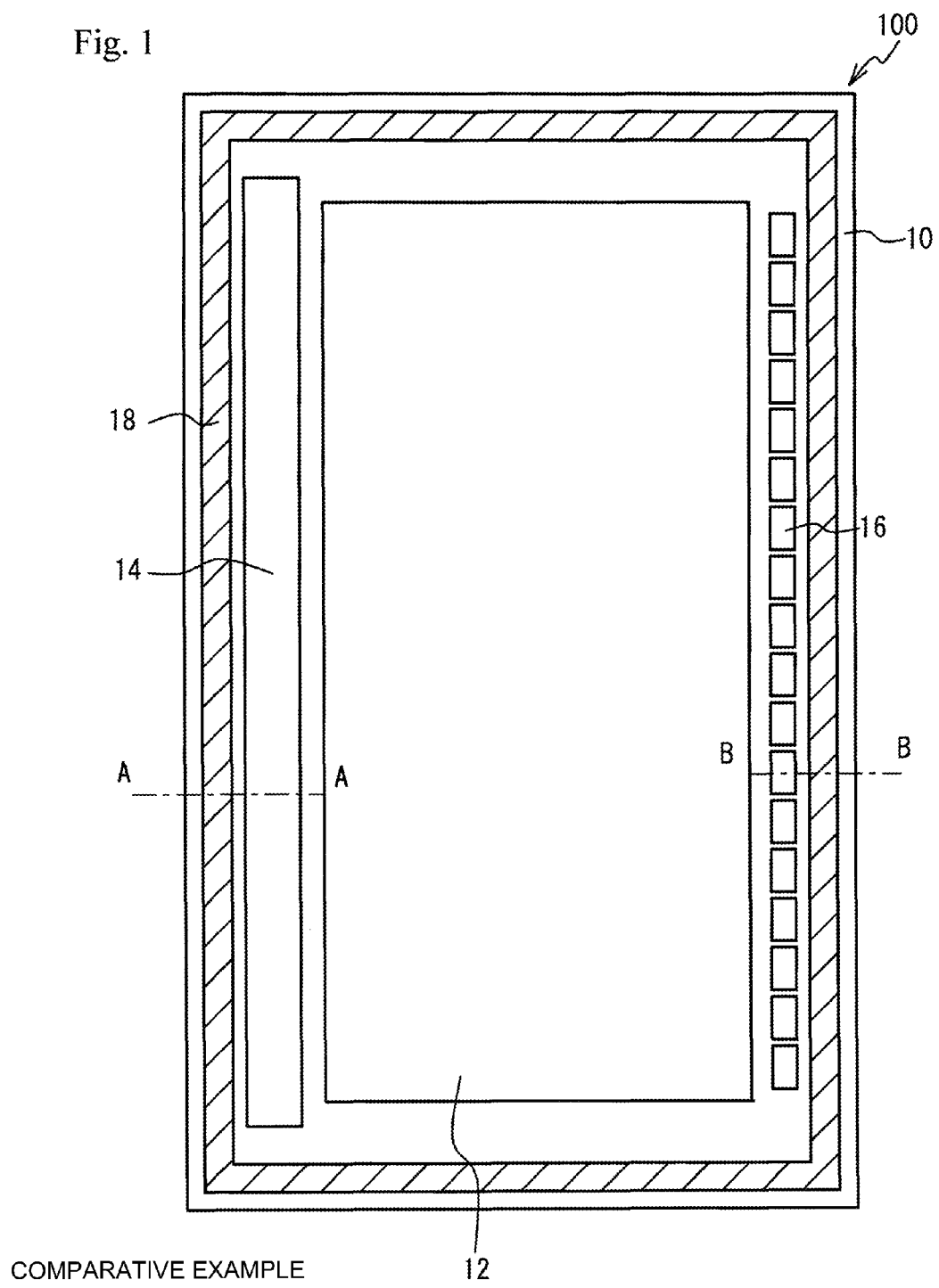
FIG. 1 is a plan view of a semiconductor device in accordance with a comparative example.

Now, a comparative example related to an aspect of an embodiment of the present invention will be described. FIG. 1 is a plan view of a semiconductor device in accordance with a comparative example. A semiconductor device 100 has an active region 12 in a semiconductor chip 10, a drain electrode pad 14 that is an output electrode pad on the semiconductor chip 10, gate electrode pads 16 that are input electrode pads on the semiconductor chip 10, and a conductive guard ring 18 formed in a peripheral area on the semiconductor chip 10 so as to run along all the sides thereof. The drain electrode pad 14 and the gate electrode pads 16 are made of, for example, gold (Au), and are electrically connected to drain electrodes and gate electrodes in the active region 12. The guard ring 18 is arranged between the drain electrode pad 14 and the corresponding side edge of the semiconductor chip 10, and is arranged between the gate electrode pads 16 and the corresponding side edge of the semiconductor chip 10. The guard ring 18 is arranged outside of the area in which all the electrode pads are provided, and is arranged in the peripheral area so as to run along all the sides of the semiconductor chip 10.

Figure 2A:
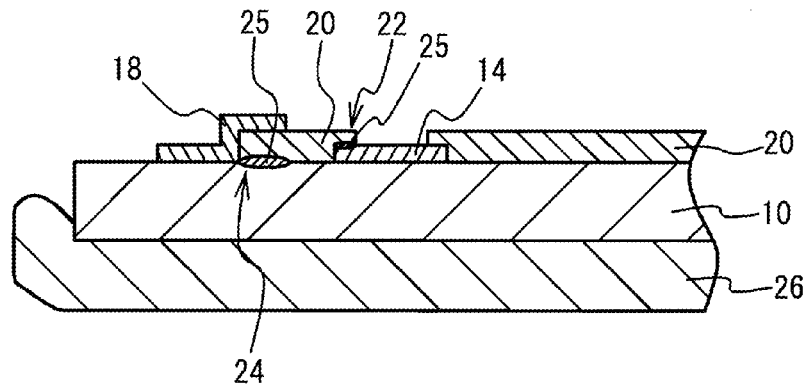
FIGS. 2A through 2C illustrate cross-sections of the comparative example and a first embodiment.
Figure 2B:
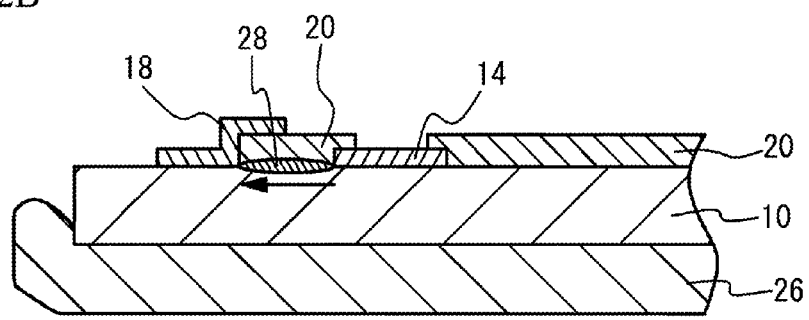
Figure 2C:
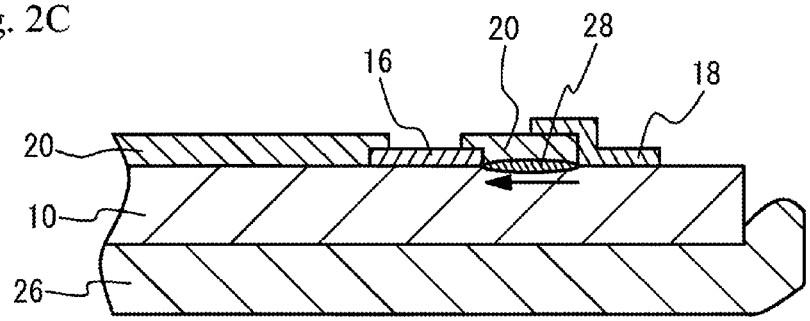

A description will now be given, with reference to FIGS. 2A through 2C, of a mechanism for causing an operative fault of the semiconductor chip 10 due to water penetration beyond the guard ring 18. FIGS. 2A and 2B are cross-sectional views taken along a line A-A depicted in FIG. 1, and FIG. 2C is a cross-sectional view taken along a line B-B depicted in FIG. 1.

Referring to FIG. 2A, the drain electrode pad 14 is provided on the semiconductor chip 10. An insulating film 20 is provided so as to extend from the semiconductor chip 10 to the top of the drain electrode pad 14 so that only a part of the drain electrode pad 14 is covered with the insulating film 20. That is, a first end 22 that is one end of the insulating film 20 is located on the drain electrode pad 14, and a second end 24 that is the other end is located on the semiconductor chip 10. Thus, an opening is defined on the drain electrode pad 14 and enables wire bonding. The insulating film 20 functions as a protection film, and may be a silicon oxide film or a silicon nitride film. As illustrated in FIG. 2C, the insulating film 20 is provided so as to cover a part of the gate electrode pads 16.

The guard ring 18 is provided so as to continuously extend from the surface of the semiconductor chip 10 over the second end 24 of the insulating film 20. The guard ring 18 covers a boundary between the insulating film 20 and the semiconductor chip 10. That is, the guard ring 18 covers a boundary between the insulating film 20 and a semiconductor layer that forms a part of the semiconductor chip 10.

A conductive layer 26 is formed on the back surface of the semiconductor chip 10 by Au plating. The conductive layer 26 functions as not only a heat sink but also a source electrode pad electrically connected to source electrodes arranged in the active region 12. Among the electrode pads on the semiconductor chip 10, the drain electrode pad 14 has the greatest potential difference with respect to the backside potential of the semiconductor chip 10 (the potential of the conductive layer 26). The conductive layer 26 extends from the back surface of the semiconductor chip 10 to the side surfaces.

The guard ring 18 suppresses water penetration through the boundary between the insulating film 20 and the semiconductor chip 10. However, water goes beyond the guard ring 18 and penetrates through the boundary between the insulating film 20 and the semiconductor chip 10 as time goes on, although the degree of water penetration is very small. Further, water may penetrate through the boundary between the insulating film 20 and the drain electrode pad 14. In FIG. 2A, areas having water penetration are indicated by a reference numeral 25.

A high electric field, which may be 30 V, for example, is applied between the drain electrode and the source electrode in order to operate the semiconductor chip 10. As has been described previously, the conductive layer 26 functions as the source electrode pad. Thus, a high electric field is developed between the drain electrode pad 14 and the conductive layer 26.

The conductive layer 26 extends up to the side surfaces of the semiconductor chip 10, and the water penetrating areas 25 are formed between the insulating film 20 and the semiconductor chip 10. Thus, ion migration between the drain electrode pad 14 and the conductive layer 26 is likely to take place due to the high electric field. As indicated by an arrow in FIG. 2B, there is a case where Au goes on to the conductive layer 26 from the drain electrode pad 14. As Au goes on, a land 28 due to deposition of Au is formed so as to extend from the drain electrode pad 14 to the guard ring 18. The land 28 brings the drain electrode pad 14 and the guard ring 18 into contact with each other. This results in a short circuit between the pad 14 and the guard ring 18. Thus, the drain electrode pad 14 and the guard ring 18 become equal to an identical potential.

On the other side of the semiconductor chip 10 on which the gate electrode pads 16 are aligned, the magnitude of the electric field developed between the gate electrode pads 16 and the conductive layer is smaller than that of the electric field developed between the drain electrode pad 14 and the guard ring 18. Thus, there is a difficulty in the occurrence of a short circuit between the gate electrode pads 16 and the guard ring 18, as compared to the short circuit between the drain electrode pad 14 and the guard ring 18.

As illustrated in FIG. 1, the guard ring 18 is arranged between the drain electrode pad 14 and the corresponding side edge of the semiconductor chip 10, and is arranged between the gate electrode pads 16 and the corresponding side edge of the semiconductor chip 10. Thus, a potential difference between the drain electrode pad 14 and the gate electrode pads 16 is applied between the gate electrode pads 16 and the adjacent guard ring 18. That is, a high electric field is applied between the gate electrode pads 16 and the guard ring 18.

Even on the other side of the semiconductor chip 10 on which the gate electrode pads 16 are arranged in line, water penetrates through the boundary between the insulating film 20 and the semiconductor chip 10. Thus, ion migration between the guard ring 18 and the gate electrode pads 16 is likely to take place due to the high electric field. Thus, as indicated by an arrow in FIG. 2C, Au goes on to the gate electrode pad 16 from the guard ring 18. Finally, the land 28 due to deposition of Au is formed so as to extend from the guard ring 18 to the gate electrode pad 16. As a result, the guard ring 18 and the gate electrode pad 16 are brought into contact with each other and a short circuit is caused therebetween. That is, a short circuit between the drain electrode pad 14 and the gate electrode pad 16 takes place. This causes an operative fault of the semiconductor chip. In order to avoid the operative fault, a conceivable way is to increase the distance between the gate electrode pads 16 and the guard ring 18. However, the above way may prevent the semiconductor chip 10 from being used efficiently.

Even if a short circuit between the guard ring 18 and at least one of the gate electrode pads 16 does not occur, breakdown may take place between the guard ring 18 and any of the gate electrode pads 16 prior to breakdown between the gate electrode and the drain electrode in a case where the guard ring 18 and the gate electrode pads 16 are close to each other or have a structure that causes a high electric field to be applied therebetween. The occurrence of such breakdown means that the semiconductor device does not have a satisfactory breakdown voltage.

A description will now be given of embodiments capable of resolving the above-described problems and restraining a short circuit of the drain electrode pad 14 and the gate electrode pads 16 on the semiconductor chip 10 even when water penetration in the semiconductor chip 10 takes place beyond the guard ring 18.

First Embodiment

Figure 3:
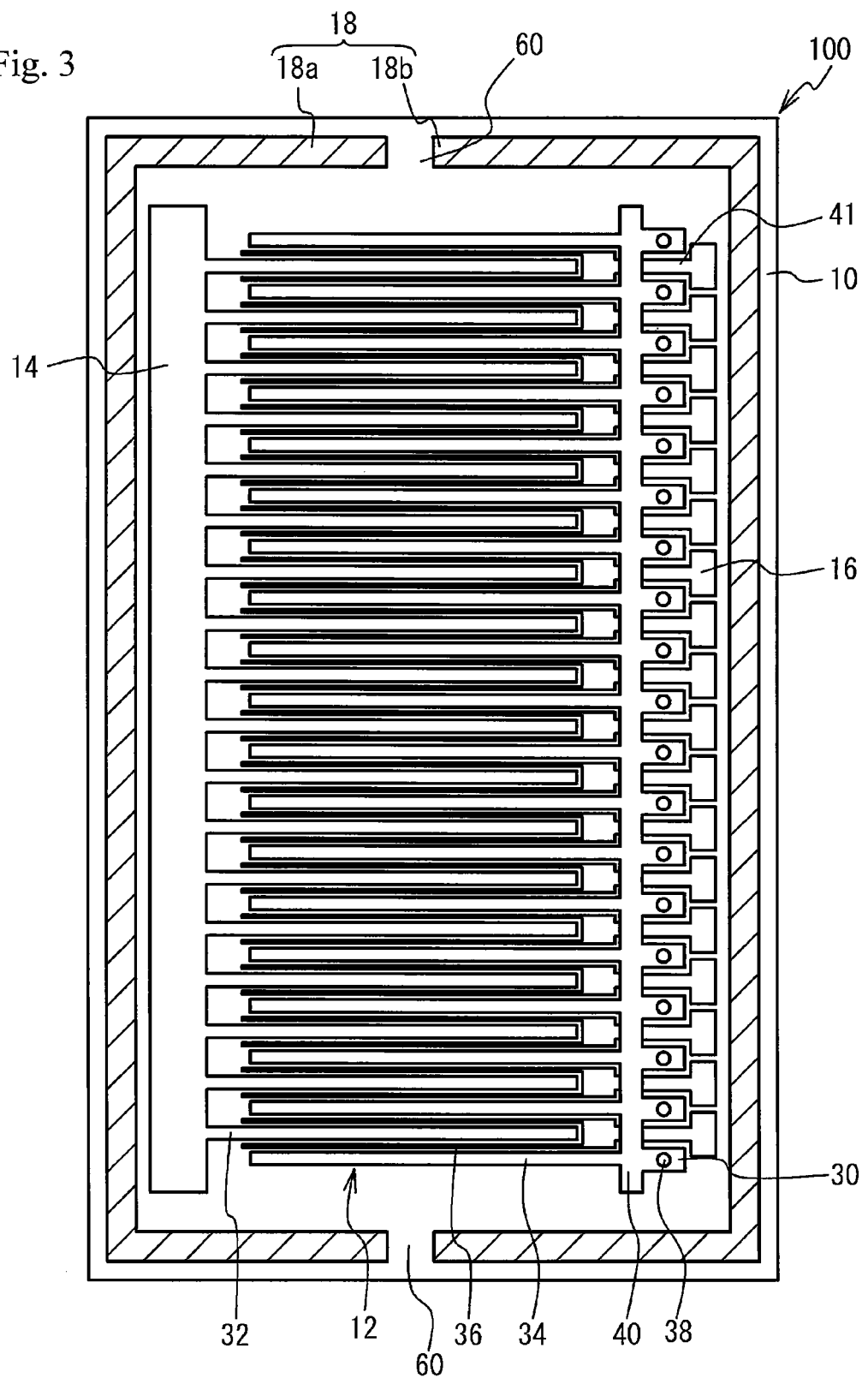
FIG. 3 is a plan view of a semiconductor device in accordance with the first embodiment.

A semiconductor device in accordance with a first embodiment is an exemplary field effect transistor (FET). FIG. 3 is a plan view of an FET 100 of the first embodiment. The FET 100 has the semiconductor chip 10 on which provided are the drain electrode pad 14, the gate electrode pads 16, source electrode pads 30, and the electrically conductive guard ring 18, which is formed in the peripheral area on the semiconductor chip 10 and is located further out than all of the electrode pads.

The semiconductor chip 10 is configured to have a GaAs substrate on which an n-type GaAs layer is formed. On the n-type GaAs layer, there are provided drain electrodes 32, source electrodes 34 and gate electrodes 36. The drain electrodes 32, the source electrodes 34 and the gate electrodes 36 are formed in finger shapes, and a plurality of channels are defined in the semiconductor chip 10. The source electrodes 34 are mutually connected by a bus bar electrode 40. The drain electrodes 32, the source electrodes 34 and the gate electrodes 36 are formed in the active region 12.

The drain electrode pad 14, the gate electrode pads 16 and the source electrode pads 30 may made of a metal such as gold. The drain electrode pad 14 are electrically connected to the drain electrodes 32. Through electrodes 38 are formed in the source electrode pads 30, and are electrically connected to the conductive layer 26 provided on the back surface of the semiconductor chip 10. The source electrode pads 30 are connected to the bus bar electrode 40 and are thus connected to the source electrodes 34. The gate electrode pads 16 are electrically connected to the gate electrodes 36 via interconnections 41 running below the bus bar electrode 40 so as to cross the electrodes 40. The bus bar electrode 40 and the interconnections 41 are electrically isolated from each other. The drain electrode pad 14 and the gate electrode pads 16 are arranged along the opposite sides of the semiconductor chip 10.

The conductive layer 26, which may be formed by Au plating, is provided on the back surface of the semiconductor chip 10 so as to extend up to the side surfaces of the semiconductor chip 10, as illustrated in FIGS. 2A through 2C. The conductive layer 26 functions as a heat sink and the source electrode pad electrically connected to the source electrode pads 30 via the through electrodes 38. Thus, the drain electrode pad 14 has a greater potential difference with respect to the backside potential of the semiconductor chip 10 than the potential difference with respect to the gate electrode pads 16. The conductive layer 26 may have another arrangement in which the conductive layer 26 does not extend to the side surfaces of the semiconductor chip 10 but covers only the back surface of the semiconductor chip 10.

The guard ring 18 may be made of an electrically conductive material such as titanium (Ti). Parts of the guard ring 18 are removed so as to be divided into two unit regions composed of a first guard ring 18a and a second guard ring 18b. The first guard ring 18a is arranged between the drain electrode pad 14 and the corresponding side edge of the semiconductor chip 10. The second guard ring 18b is arranged between the gate electrode pads 16 and the corresponding side edge of the semiconductor chip 10. The first guard ring 18a and the second guard ring 18b are electrically isolated from each other. The first guard ring 18a and the second guard ring 18b are isolated from each other via guard ring isolating sections 60.

The FET 100 has cross sections as illustrated in FIGS. 2A and 2C, and a description thereof is thus omitted here.

A case will now be considered where water penetration takes place beyond the guard ring 18. The water penetration may cause a short circuit between the drain electrode pad 14 and the guard ring 18a, which are thus at an identical potential by the mechanism that has been described with reference to FIGS. 2A and 2B. However, the first guard ring 18a and the second guard ring 18b are electrically isolated from each other, and the second guard ring 18b does not become equal to the potential of the drain electrode pad 14.

As described above, the semiconductor device of the first embodiment has the guard ring 18 composed of the first guard ring 18a and the second guard ring 18b that are electrically isolated from each other by the guard ring isolating sections 60. The first guard ring 18a is provided between the drain electrode pad 14 and the corresponding side edge of the semiconductor chip 10. The second guard ring 18b is provided between the gate electrode pads 16 and the corresponding side edge of the semiconductor chip 10. Thus, even if water penetration takes place beyond the guard ring 18, the second guard ring 18b does not become equal to the potential of the drain electrode pad 14. It is thus possible to prevent the occurrence of a short circuit between the gate electrode pads 16 and the drain electrode pad 14 due to the mechanism described with reference to FIG. 2C and to reduce the possibility of the occurrence of operative faults of the semiconductor chip 10.

Since the second guard ring 18b does not become equal to the potential of the drain electrode pad 14, high electrode field is not applied between the second guard ring 18b and the gate electrode pads 16. It is thus possible to suppress a Short circuit of the second guard ring 18b and the gate electrode pads 16 due to ion migration previously described with reference to FIG. 2C.

Since the high electric field is not developed between the second guard ring 18b and the gate electrode pads 16, it is possible to prevent the occurrence of a short circuit between the second guard ring 18b and the gate electrode pads 16 prior to a possible short circuit between the gate electrodes 36 and the drain electrodes 32. It is thus possible to prevent the breakdown voltage of the semiconductor chip 10 from being degraded.

The guard ring isolating sections 60 are preferably provided along sides of the semiconductor chip 10 other than those along which the first guard ring 18a and the second guard ring 18b run.

For example, in a case where one of the guard ring isolating sections 60 is provided between the drain electrode pad 14 and the corresponding side edge of the semiconductor chip 10, if water penetration takes place via this guard ring isolating section 60, the potential difference between the backside potential of the semiconductor chip 10 and the drain electrode pad 14 develops ion migration. This may cause a short circuit between the drain electrode pad 14 and the first guard ring 18a or between the drain electrode pad 14 and the second guard ring 18b. In order to avoid the above short circuit, as illustrated in FIG. 3, it is preferable to arrange the guard ring isolating sections 60 between the source electrodes 34 of the potential substantially equal to the backside potential of the semiconductor chip 10 and the corresponding edges of the semiconductor chip 10, as depicted in FIG. 3. Thus, even if water penetration takes place via the guard ring isolating sections 60, the occurrence of ion migration is restricted because the backside potential of the semiconductor chip 10 and the potential of the source electrodes 34 are substantially equal to each other.

As illustrated in FIGS. 2A through 2C, it is preferable that the guard ring 18 is continuously provided from the semiconductor chip 10 to the insulating film 20 so as to cover the semiconductor chip 10 and the insulating film 20. Preferably, the guard ring 18 covers the boundary between the insulating film 20 and the semiconductor layer that is a part of the semiconductor chip 10. With this structure, it is possible to prevent water penetration in the boundary between the insulating film 20 and the semiconductor chip 10 and to prevent water from reaching the drain electrode pad 14 and the gate electrode pads 16. The unique arrangement of the guard ring 18 illustrated in FIGS. 2A through 2C prevents ion migration from progressing and prevents the electrode pads from corroding.

The first guard ring 18a is provided between the drain electrode pad 14 and the corresponding side edge of the semiconductor chip 10. As has been described with reference to FIGS. 2A through 2C, the high electric field that is applied between the drain electrode pad 14 and the conductive layer 26 is likely to develop ion migration. The occurrence of ion migration is facilitated due to the presence of water. The first guard ring 18a provided between the drain electrode pad 14 and the corresponding side edge of the semiconductor chip 10 prevents water penetration in the vicinity of the drain electrode pad 14 and prevents the occurrence of ion migration resulting from the drain electrode pad 14.

The drain electrode pad 14 and the gate electrode pads 16 are provided along the opposite sides of the semiconductor chip 10. This arrangement is likely to cause a short circuit between the drain electrode pad 14 and the gate electrode pads 16. However, the structure of the first embodiment is capable of suppressing the occurrence of such a short circuit in the above arrangement.

Figure 4:
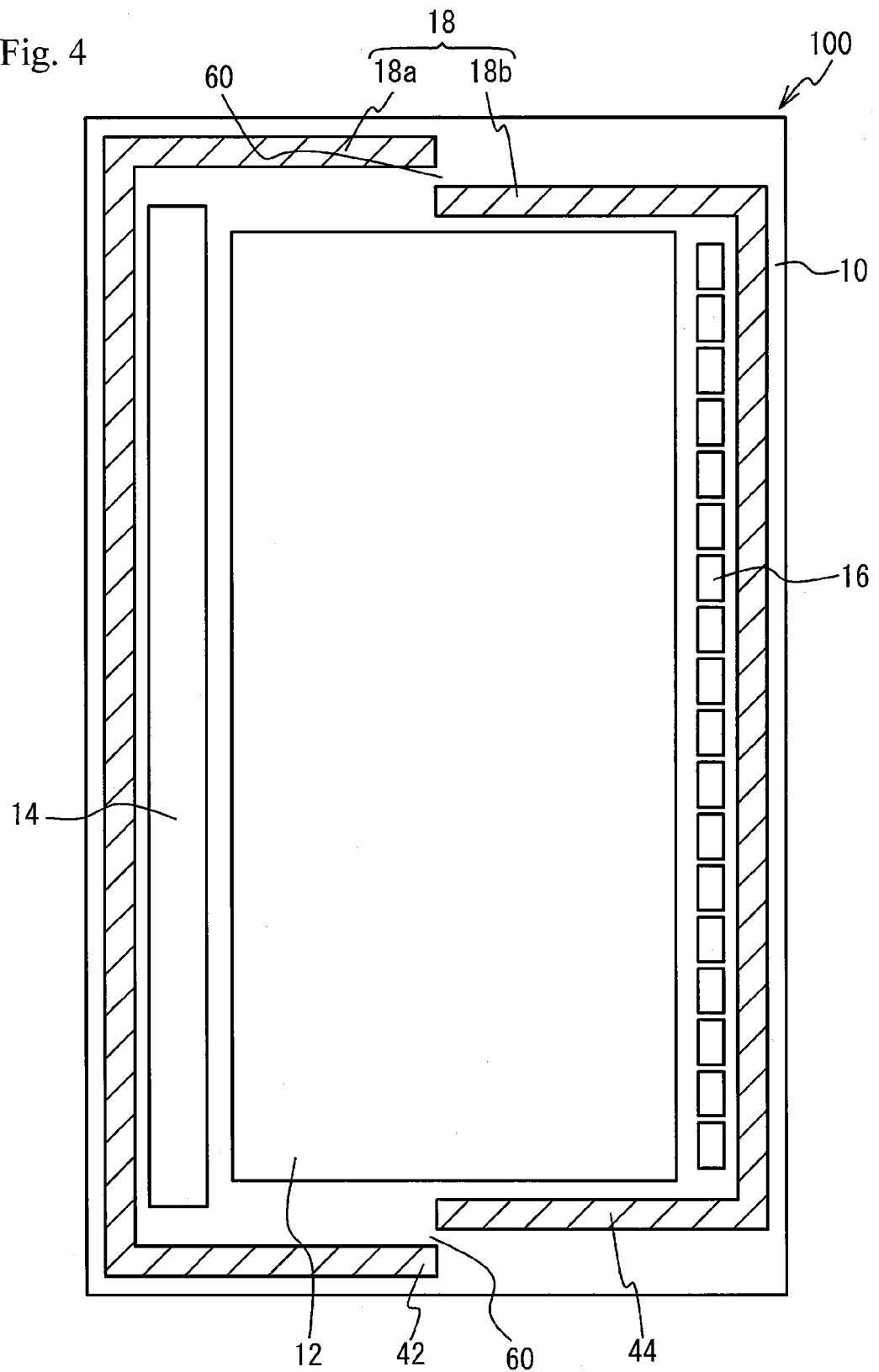
FIG. 4 is a plan view of a semiconductor device in accordance with a first variation of the first embodiment.

FIG. 4 is a plan view of a first variation of the first embodiment. Referring to FIG. 4, the first guard ring 18a and the second guard ring 18b are not arranged in line but are arranged stepwise. End portions 42 of the first guard ring 18a are further out than end portions 44 of the second guard ring 18b in the semiconductor chip 10. In other words, the end portions 44 of the second guard ring 18b are further in than the end portions 42 of the first guard ring 18a. The other arrangements of the first guard ring 18a and the second guard ring 18b in FIG. 4 are similar to those of the first and second guard rings 18a and 18b employed in the first embodiment. In an alternative arrangement, the end portions 42 of the first guard ring 18a are further in than the end portions 44 of the second guard ring 18b.

According to the semiconductor device configured in accordance with the first variation of the first embodiment, the first and second guard rings 18a and 18b are arranged stepwise and are electrically isolated from each other. Even with this structure, it is possible to suppress the occurrence of a short circuit between the gate electrode pads 16 and the drain electrode pad 14. The first and second guard rings 18a and 18b in FIG. 4 totally face the all the sides of the semiconductor chip 10. Thus, water penetration in the semiconductor chip 10 can be prevented.

Figure 5:
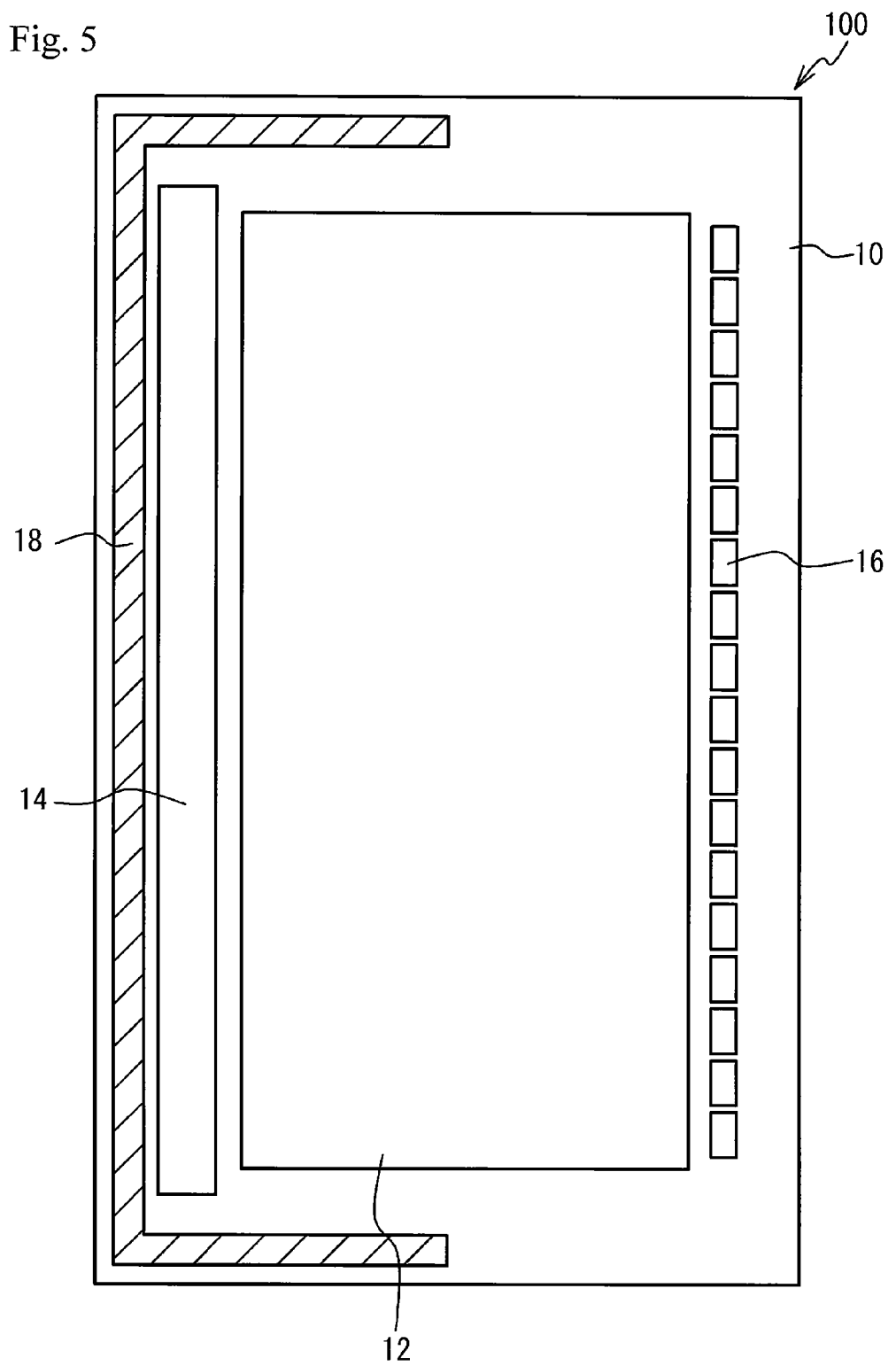
FIG. 5 is a plan view of a semiconductor device in accordance with a second variation of the first embodiment.

FIG. 5 is a plan view of a second variation of the first embodiment. The guard ring 18 is provided only between the drain electrode pad 14 and the related sides of the semiconductor chip 10, and the other portions are omitted. The other structures of the guard ring 18 are the same as those of the guard ring employed in the first embodiment that have been described with reference to FIG. 3.

According to the semiconductor device configured in accordance with the second variation of the first embodiment, the guard ring 18 is not provided along the side of the semiconductor chip 10 with which the gate electrode pads 16 are aligned but is arranged along the opposite side and the other two sides. The guard ring 18 is further out than the drain electrode pad 14 so as to separate the drain electrode pad 14 from the corresponding side of the semiconductor chip 10. It is thus possible to suppress the occurrence of a short circuit between the date electrode pads 16 and the drain electrode pad 14. Further, a high electric field is not developed between the gate electrode pads 16 and the conductive layer 26. Thus, ion migration is unlike to take place in the gate electrode pads 16 in the absence of the guard ring between the gate electrode pads 16 and the corresponding side edge of the semiconductor chip 10.

The first embodiment, the first variation and the second variation are capable of suppressing the occurrence of a short circuit between the gate electrode pads 16 and the drain electrode pad 14 and reducing the possibility of operative faults of the semiconductor chip 10.

In the first embodiment, the guard ring 18 is made of Ti. However, the guard ring 18 may be made of another material that is resistant to water, which may be platinum (Pt) or tantalum (Ta).

The semiconductor chip 10 is not limited to GaAs but may be made of a GaAs-based semiconductor that includes Ga and As. Examples of the GaAs-based semiconductor si InGaAs and AlGaAs. The semiconductor chip 10 may be made of an InP-based semiconductor that includes In and P or a GaN-based semiconductor that includes Ga and N. The semiconductor chip 10 may be made of Si-based semiconductor that includes Si. Examples of the InP-based semiconductor is InP, InGaAsP, InAlGaP and InAlGaAsP. The GaN-based semiconductor may be GaN, InGaN, AlGaN and InAlGaN.

Second Embodiment

Figure 6:
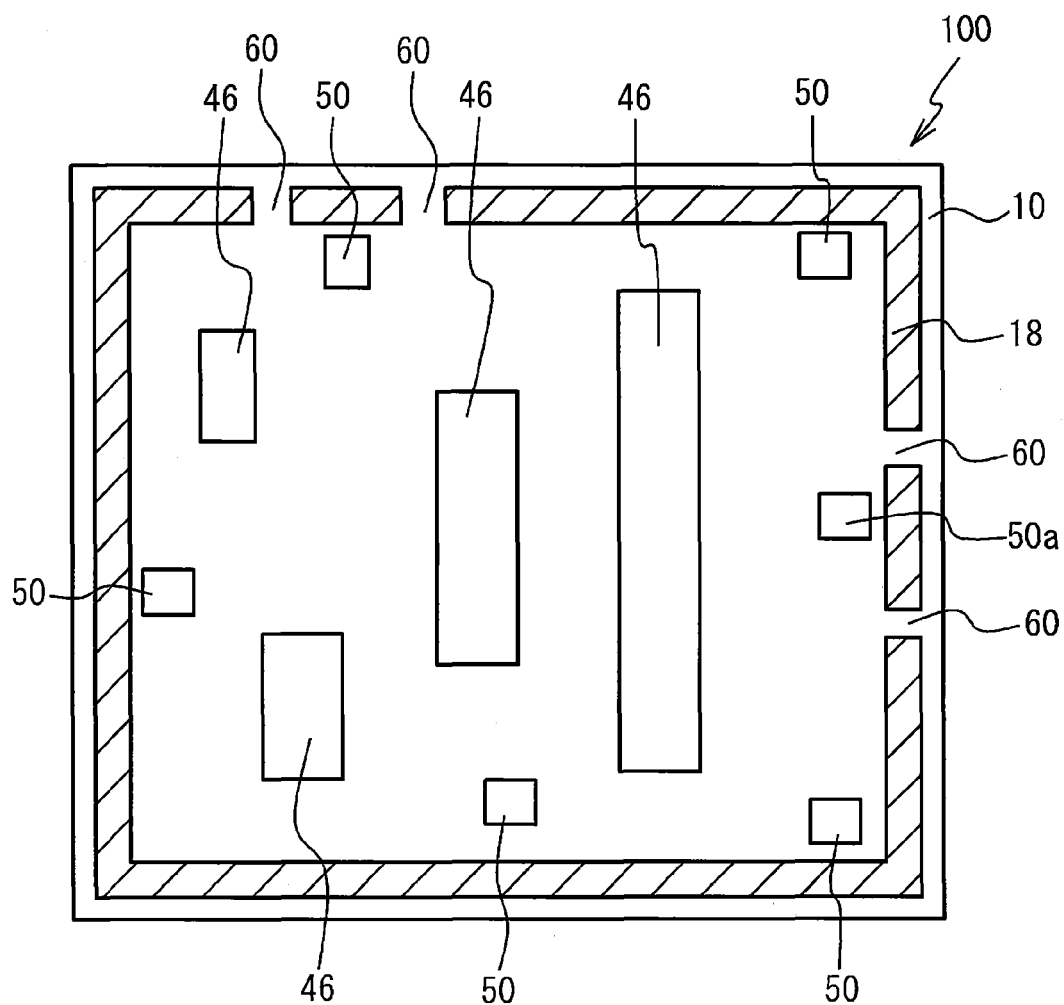
FIG. 6 is a plan view of a semiconductor device in accordance with a second embodiment.

A semiconductor device in accordance with a second embodiment is an exemplary MMIC (Monolithic Microwave Integrated Circuit). FIG. 6 is a plan view of the semiconductor device of the second embodiment. The semiconductor device 100 illustrated in FIG. 6 includes the semiconductor chip 10, multiple electrodes 50 provided on the semiconductor chip 10, and the guard ring 18, which is provided further out than all of the electrodes 50.

A plurality of FETs 46 are formed in the semiconductor chip 10, and the drain gate and source electrodes of the FETs 46 are respectively connected to the corresponding electrodes 50. The FETs 46 have the respective active regions 12, which have been described with reference to FIG. 3. Interconnections that connect the FETs 46 and the electrodes 50 are not depicted for the sake of simplicity. Although not illustrated in FIG. 6, the semiconductor chip 10 has the conductive layer 26 functioning as the heat sink and the electrode on the back surface of the semiconductor chip 10 as in the case of the first embodiment. The conductive layer 26 extends to the side surfaces of the semiconductor chip 10.

The guard ring isolating sections 60 are provided so as to electrically isolate the guard ring 18 arranged between an electrode 50a having the greatest potential difference with respect to the backside potential of the semiconductor chip 10 and the corresponding side edge from the guard rings 18 arranged between the other electrodes 50 and the corresponding side edges.

The second embodiment is capable of suppressing a short circuit between the electrode 50a and any of the other electrodes 50 even if a short circuit between the electrode 50a and the guard ring 18 due to water penetration in the semiconductor chip 10. It is thus possible to reduce the possibility of the occurrence of operative faults of the semiconductor chip 10.

As illustrated in FIG. 6, three or more guard ring isolating sections 60 are provided in the second embodiment. The guard ring 18 is thus composed of three or more unit regions, which are electrically isolated from each other. With this arrangement, even if a short circuit between one electrode and the guard ring 18 takes place, the possibility of the occurrence of a short circuit between another guard ring and an electrode having another potential. This is advantageous to semiconductor devices like MMICs having multiple electrodes having many different potentials on the semiconductor chip 10.

The present invention is not limited to the specifically disclosed embodiments and variations but may include other embodiments and variations without departing from the scope of the present invention.

What is claimed is:

1. A semiconductor device comprising:
   a semiconductor chip having a first side edge and a second side edge which is an opposite side of the first side edge;
   first electrodes provided in an area which is closer to the first side edge than to the second side edge on the semiconductor chip;
   a second electrode provided in an area which is closer to the second side edge than to the first side edge on the semiconductor chip and having a greater potential difference with respect to a backside potential of the semiconductor chip than potential differences between the first electrodes and the backside potential of the semiconductor chip; and
   a guard ring made of an electrically conductive material, arranged between the second electrode and the second side edge and extended toward side edges of the semiconductor chip which exists in a longer direction of the second electrode,
   wherein the guard ring extends along the side edges of the semiconductor chip and both ends of the guard ring are not connected to each other,
   wherein an entirety of an area between the first electrodes and the first side edge is free of any guard ring; and
   wherein the guard ring covers a boundary between an edge of an insulating film on a semiconductor layer included in the semiconductor chip and the semiconductor layer in contact with the edge of the insulating film and contacts a surface of the insulating film and a surface of the semiconductor layer.

2. The semiconductor device as claimed in claim 1, wherein the guard ring is made of one of titanium, tantalum and platinum.

3. The semiconductor device as claimed in claim 1, wherein the second electrode is a drain electrode pad.

\* \* \* \* \*